Dec. 13, 1966 E. SIRTL 3,291,657

EPITAXIAL METHOD OF PRODUCING SEMICONDUCTOR MEMBERS USING
A SUPPORT HAVING VARYINGLY DOPED SURFACE AREAS
Filed Aug. 9, 1963

United States Patent Office 3,291,657

Patented Dec. 13, 1966

3,291,657
EPITAXIAL METHOD OF PRODUCING SEMICONDUCTOR MEMBERS USING A SUPPORT HAVING VARYINGLY DOPED SURFACE AREAS

Erhard Sirtl, Munich, Germany, assignor to Siemens & Halske Aktiengesellschaft, Berlin, Germany, a corporation of Germany Filed Aug. 9, 1963, Ser. No. 301,035
Claims priority, application Germany, Aug. 23, 1962, S 81,057
1 Claim. (Cl. 148—175)

My invention relates to the production of semiconductor members for diodes, transistors, semiconductor controlled rectifiers and other semiconductor devices, by precipitating monocrystalline semiconductor layers from a gaseous semiconductor compound onto a semiconductor substrate placed upon a heated support.

Such epitaxial precipitation methods serve to produce a semiconductor layer sequence of respectively different specific resistance and/or type of conductance. The methods require heating the support of the substrates, usually in form of plates, discs or wafers, to such a high temperature that the substrate surface facing away from the support assumes the reaction temperature required for thermal dissociation of a gaseous halogen compound of the semiconductor substance passing through the reaction vessel, thereby causing a monocrystalline growth of the precipitating semiconductor substance upon the free surfaces of the substrates.

It is an object of my invention to simplify the production of epitaxial layers with respect to the preparation of the support employed as a source of the semiconductor substances to be epitaxially precipitated, and to avoid the necessity of first producing a densely crystalline supporting plate for use as such a source.

Another object of my invention is to simplify the production of epitaxial layers in cases where the starting material is available in form of a powder or irregular crystal aggregate rather than as a dense polycrystalline or mono crystalline body.

According to my invention, I perform an epitaxial precipitation method generally of the above-mentioned kind by employing as the heating support for the semiconductor substrate body a powder of the semiconductor substance to be precipitated, and I place the substrate on top of the pulverulent support to be heated from the support to the reaction temperature, and subject the top surface of the support to a gaseous atmosphere containing a substance capable of forming a gaseous compound with the comminuted semiconductor material of the support. As a result, semiconductor substance from the gaseous compound is transferred to the substrate and precipitated as as compact crystalline or monocrystalline layer onto the substrate bottom surface facing the pulverulent support.

The precipitation of the semiconductor substance by means of this method is caused by a chemical transport reaction in a reaction zone constituted by the gas space between the top of the support and the adjacent bottom surface of the substrate body. Preferably, the temperature transition necessary for development of a transport reaction is produced by the heat transfer from the directly or indirectly heated support of comminuted semiconductor material to the substrate, such as a plate-shaped semiconductor body, on top of the support.

For example, when the support is formed of silicon powder and its top side, facing the semiconductor body to be provided with an epitaxially grown layer, is subjected to the action of hydrogen chloride, a silicon transport from the support to the semiconductor occurs in accordance with the equation $$\text{(1)} \qquad Si + 2HCl \underset{\text{low temperature}}{\overset{\text{high temperature}}{\rightleftarrows}} SiCl_2 + H_2$$

A silicon transport can also be effected in an atmosphere free of hydrogen and hydrogen halide and containing for example a halide of the semiconductor substance. An example of such a transport reaction is given by the equation $$\text{(2)} \qquad Si + SiCl_4 \underset{\text{low temperature}}{\overset{\text{high temperature}}{\rightleftarrows}} 2SiCl_2$$

It has been found in conjunction with the invention that by means of a transport reaction in the space between support and substrate body, it becomes possible also to form large-area monocrystalline layers on the bottom side of the substrate from substances that heretofore have been producible only in the form of powder or irregular crystal aggregates, using a support formed of such a powder and causing the semiconductor substance to be transported to the bottom side of a substrate material whose lattice points have virtually the same spacing as the atoms in the substance to be transported. The monocrystalline layers thus produced can thereafter be employed as carriers for further precipitation. For example, additional epitaxial layers can be grown on a preceding epitaxial layer by performing another transport reaction. In this manner relatively large monocrystalline bodies with planar-parallel boundaries can be produced. Thus, ZnS can be precipitated upon Si, ZnS upon GaP, GaP upon Si, and AlN upon SiC.

It has been found that an oriented growth is still possible if the carrier or substrate body appertains to a different symmetry-class of substances. Thus, for example, the epitaxial method according to the invention can be performed by growing layers upon silicates, halogenides (halides), oxides and carbides, particularly if given crystal-splitting planes are made the surface for receiving the precipitate.

According to a preferred embodiment of the invention, the above-mentioned support is formed of powder preparatorily pressed into the shape of tablets. If desired, the crystal powder can be pressed into tablets with the aid of a binding medium that can be readily evaporated without leaving a residue. Camphor, polyvinyl alcohol and polyvinyl acetate, for example, are suitable as binding agents. The pressed tablets of pulverulent semiconductor material containing the binding agent can be conveniently stored and handled. Prior to performing the epitaxial process, the tablets can be preheated for the purpose of removing the binding medium.

The use of shaped tablets in conjunction with semiconductor substances available in compact crystalline form, such as with germanium and silicon or other $A^{III}B^{V}$ or $A^{II}B^{VI}$ semiconductor compounds, is also of advantage. For example, the production of crystal powder and of pressed tablets formed of such crystal powder is much less troublesome and costly than the production of polycrystalline supporting plates, even when the semiconductor material is silicon or germanium, for example.

The invention will be further described with reference to the accompanying drawing in which.

Figure 1:
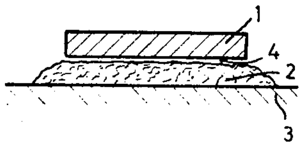
FIG. 1 shows schematically and in vertical section an assembly of a semiconducting substrate body and a pulverulent support during processing according to the invention.

Shown in FIG. 1 is a heater 3 consisting, for example, of a graphite body coated with silicon carbide and heated by direct passage of electric current. The crystal powder 2 of semiconductor substance constituting a transfer mass is deposited on top of the heater 3, and the substrate body 1, preferably a monocrystalline semiconductor plate or disc, is placed on top of the transfer mass or powder support, for production of an epitaxial layer on the bottom face of the body 1. This assembly is heated in a gas atmosphere to a sufficiently high temperature to obtain in the interspace 4 a transport of substance from the pulverulent support 2 to the semiconductor body 1. It is preferable to employ a semiconductor 1 which is planar and polished at least on its bottom side facing the support.

The particular reaction vessel and the appertaining devices for mounting and heating the heater 3 are not essential to the invention proper and need not necessarily depart from corresponding equipment as used in the known processes mentioned above. However, if desired, reference may be had to suitable processing equipment illustrated and described in my copending application Serial No. 301,036, now abandoned, filed concurrently herewith for Method of Producing Semiconductor Members, and assigned to the assignee of the present invention.

Figure 2:
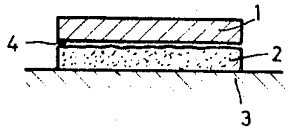
FIGS. 2 and 3 show similar sectional views of respective modified assemblies.

In the modification shown in FIG. 2, the crystal powder is pressed into the shape of a tablet or transfer body 2 which is about the same size as the semiconductor body 1.

Figure 3:
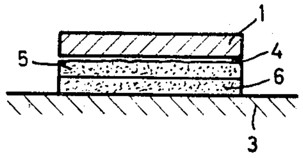

FIG. 3 shows a processing assembly of components in which the pressed tablet is composed of two layers 5 and 6 of respectively different conductance property, namely different specific resistances and/or different types of conductance i.e. n- or p-types. By choice of the suitable transport agents, that is the suitable gas atmospheres, this doping can be quantitatively transmitted so that layers of suitable doping are sequentially grown epitaxially upon the bottom side of the monocrystalline semiconductor disc 1. Thus, for example, when using a tablet of silicon and operating in a transport system corresponding to Equation 1 the dopant is quantitatively transferred. As a result, monocrystalline silicon layers, which may contain p-n junctions, are grown onto the bottom side of the semiconductor body 1 consisting, for example, of silicon or zinc sulfide.

On the other hand, to support a quantitative transfer of doping substance with gallium arsenide, the gaseous atmosphere must be free of hydrogen and hydrogen halide and must contain the gaseous semiconductor compound in diluted constitution. Iodine vapor diluted with argon may be used as gaseous atmosphere for example. The transport of substance then occurs in accordance with the equation (3)
$$GaAs + \tfrac{1}{2}I_2 \underset{\text{low temperature}}{\overset{\text{high temperature}}{\rightleftarrows}} GaI + \tfrac{1}{4}As_4$$

In this process the semiconductor body to receive the epitaxial layer may consist of gallium arsenide or of germanium, for example.

To prevent erosion of semiconductor material from the top and the remainder of the free surface of the semiconductor body, the top surface is preferably covered with a plate of inert material, for example silicon carbide, quartz or aluminum oxide (sapphire), or the entire free surface of the semiconductor substrate body is coated with a gas-tight coating consisting of the carbide or oxide of the semiconductor material. These protective expedients are more fully described in my above-mentioned copending application filed concurrently herewith, to which reference may be had if desired.

Figure 4:
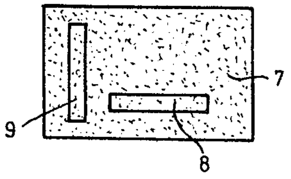
FIG. 4 is a plan view and FIG. 5 a side elevation of a pressed tablet for use as a powder-mass support in the process of the invention.

By forming tablets from crystal powder having respectively different doping additives, the pressed tablets can be given a predetermined pattern. Thus, for example, FIG. 4 shows a tablet in top view and FIG. 5 in section in which the portion 7 of the tablet consists of p-doped crystal powder whereas the portions 8 and 9 are formed of n-doped crystal powder. Molds of corresponding configuration are preferably employed for producing such pressed tablets.

Figure 5:
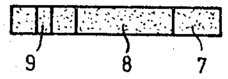

In this manner any desired pattern can be obtained. For example, as shown in FIG. 5, the mutually opposed doping zones 8 and 9 may extend through the entire thickness of the tablet, or only part of the thickness may be formed of the opposingly doped crystal body. Since these patterns produced in the pressed tablet are epitaxially transferred in the same form upon the bottom side of the semiconductor substrate body, this method is particularly well suited for the production of solid-state circuits whose active and passive components are combined in a semiconductor plate and are formed by appropriately doped zones or areas.

Depending upon the choice of the transport medium, the method of the invention also affords the production of extremely pure and particularly monocrystalline layers from crystal powder. For example, when silicon powder is employed as the support and is heated according to FIG. 1 or FIG. 2 to a temperature of 1200° C. in a gas mixture which contains $SiCl_4$ or $Cl_2$ that is free of hydrogen or hydrogen halide, then any impurities in the silicon powder are only very poorly transported and are merged into the epitaxial crystal layer only to such a slight extent that the precipitated layer growing on the bottom side of the semiconductor body, which is a silicon plate for example, exhibits an extremely high degree of purity.

The method according to the invention can be used, for example, to precipitate zinc sulfide onto gallium phosphide in monocrystalline form by employing a pressed powder tablet of zinc sulfide as support and placing on top of this support a monocrystalline plate of gallium phosphide. If the support is heated to 1000° C. in an atmosphere consisting of $I_2$ diluted with argon, then the transport reaction takes place in accordance with the equation (4)
$$ZnS + \tfrac{1}{2}I_2 \underset{\text{low temperature}}{\overset{\text{high temperature}}{\rightleftarrows}} ZnI + \tfrac{1}{4}S_4$$

As a result, zinc sulfide is epitaxially grown on the plate of germanium phosphide.

In the iodine system, such compounds as zinc sulfide, for example, can be caused to grow in a simple manner in form of a monocrystalline layer upon silicon, or gallium phosphide can thus be grown on silicon, by using as support a pressed tablet formed of zinc sulfide powder and gallium-phosphide crystal powder respectively.

In another mode of processing according to the invention, silicon powder which is pressed into the shape of a tablet is employed as a support, and the support and the semiconductor substrate body which is placed on top of the support are first heated in a hydrogen current to 1200° C. in order to remove the oxide coating from the silicon. Thereafter a reaction mixture composed of $SiCl_4$ and $H_2$ in the ratio 1:5 is fed into the reaction vessel.

The transport reaction corresponds to the equation (5) $SiCl_4+2H_2 \rightarrow Si+2HCl$ As a result, silicon is transported onto the semiconductor body, which, for example, may also consist of silicon. If the free surface of the silicon body is not covered or provided with a gas-tight coating, as described above, the silicon will also precipitate upon the free surface. The interspace 4 between support and silicon body becomes enriched with hydrogen chloride, and the silicon from the tablet is transported in accordance with the Equation 1 to the bottom side of the monocrystalline silicon plate where it forms a monocrystalline layer.

The use of pulverulent semiconductor substance, according to the invention, has the further advantage that by mixing selected standard doping substances, the pressed tablets can be given any desired content of doping substance.

The semiconductor body used as substrate or carrier can also be subsequently eliminated, for example by grinding, after performing the transport reaction. In this manner the compact or monocrystalline layers resulting from the epitaxial transport reaction can be separated from the substrate body used during the production process.

To those skilled in the art it will be obvious, upon a study of this disclosure, that my invention permits of various modifications with respect to the arrangement of the solid components that enter into the transport reaction as well as with respect to the particular substances and compositions employed, and hence can be given embodiments other than particularly illustrated or described herein, without departing from the essential features of my invention and within the scope of the claim annexed hereto.

I claim:

The method of producing a semiconductor member by precipitating a semiconductor layer from a gaseous compound of semiconductor substance onto a substrate body, which comprises pressing crystal powders containing a semiconductor substance to be precipitated and including respectively varying doping substances into the shape of a tablet to produce surface areas of respectively varying doping on its top side to provide a transfer body, placing the substrate body on the top side of the pulverulent transfer body, heating the substrate body from the transfer body to a temperature at which a transport reaction occurs and simultaneously subjecting the top side of the transfer body to a gas atmosphere capable of forming a gaseous compound with said semiconductor substance, whereby the pattern of said varyingly doped surface areas is epitaxially transported onto the side of the semiconductor body facing said transfer body.

References Cited by the Examiner

UNITED STATES PATENTS

| | | | |
|---|---|---|---|
| 3,047,438 | 7/1962 | Marinace | 148—175 |
| 3,072,507 | 1/1963 | Anderson et al. | 148—175 |
| 3,099,579 | 7/1963 | Spitzer et al. | 148—175 |
| 3,142,596 | 7/1964 | Theuerer | 148—175 |

OTHER REFERENCES

Metallurgy of Semiconductor Materials, Interscience Publishers, August 30–September 1, 1961, publication for the AIME, vol. 15, pages 76–80.

Tung, Metallurgy of Semiconductor Materials, vol. 15, Interscience Publishers, Aug. 30–Sept. 1, 1961, pages 87–102, in particular page 94.

DAVID L. RECK, *Primary Examiner.*

N. F. MARKVA, *Assistant Examiner.*